United States Patent
Novotny

(10) Patent No.: US 7,327,578 B2
(45) Date of Patent: Feb. 5, 2008

(54) COOLING FAILURE MITIGATION FOR AN ELECTRONICS ENCLOSURE

(75) Inventor: Shlomo Novotny, Wayland, MA (US)

(73) Assignee: Sun Microsystems, Inc., Santa Clara, CA (US)

(*) Notice: Subject to any disclaimer, the term of this patent is extended or adjusted under 35 U.S.C. 154(b) by 103 days.

(21) Appl. No.: 10/774,314

(22) Filed: Feb. 6, 2004

(65) Prior Publication Data

US 2005/0174733 A1 Aug. 11, 2005

(51) Int. Cl.
H05K 7/20 (2006.01)
F28D 21/00 (2006.01)

(52) U.S. Cl. .............. 361/724; 361/695; 165/104.33; 165/104.34

(58) Field of Classification Search ........... 361/695, 361/724; 165/104.33, 104.34, 104.14
See application file for complete search history.

(56) References Cited

U.S. PATENT DOCUMENTS

| | | | |
|---|---|---|---|
| 2,012,527 | A | 8/1935 | Batchelder |
| 2,675,228 | A | 4/1954 | Baird |
| 3,571,677 | A | 3/1971 | Oeschger |
| 4,138,692 | A | 2/1979 | Meeker |
| 4,259,401 | A * | 3/1981 | Chahroudi et al. ......... 52/302.3 |
| 4,495,545 | A | 1/1985 | Dufresne et al. |
| 4,558,395 | A | 12/1985 | Yamada |
| 4,665,466 | A | 5/1987 | Green |
| 4,721,996 | A | 1/1988 | Tustaniwskyj |
| 4,729,424 | A | 3/1988 | Mizuno |
| 4,733,331 | A | 3/1988 | Chauvet |
| 4,791,983 | A | 12/1988 | Nicol |
| 4,809,134 | A | 2/1989 | Tustaniwskyj |
| 4,870,477 | A | 9/1989 | Nakanishi |
| 4,882,654 | A | 11/1989 | Nelson |
| 4,977,444 | A | 12/1990 | Nakajima |
| 5,115,225 | A * | 5/1992 | Dao et al. ................... 340/584 |
| 5,144,531 | A | 9/1992 | Go |
| 5,166,863 | A | 11/1992 | Shmunis |
| 5,177,667 | A | 1/1993 | Graham |
| 5,183,104 | A | 2/1993 | Novotny |
| 5,323,847 | A | 6/1994 | Koizumi |
| 5,406,807 | A | 4/1995 | Ashiwake |
| 5,465,192 | A | 11/1995 | Yoshikawa |

(Continued)

FOREIGN PATENT DOCUMENTS

EP 0 746 192 A 12/1996

(Continued)

OTHER PUBLICATIONS

"Protection for Today's Needs ... And Tomorrow's Opportunities", Liebert Foundation ,US.

(Continued)

*Primary Examiner*—Anatoly Vortman
(74) *Attorney, Agent, or Firm*—Dorsey & Whitney LLP

(57) ABSTRACT

A system for permitting orderly shutdown of electronic components. The system includes an enclosure populated with one or more electronic components. A fan positioned within the enclosure generates an airflow across the one or more electronic components, the airflow being cooled by a heat exchanger. A phase change material is positioned within the enclosure to absorb heat from the airflow in the event of a failure associated with the heat exchanger.

33 Claims, 3 Drawing Sheets

U.S. PATENT DOCUMENTS

| | | | |
|---|---|---|---|
| 5,535,094 A | 7/1996 | Nelson | |
| 5,675,473 A | 10/1997 | McDunn | |
| 5,701,045 A | 12/1997 | Yokozawa | |
| 5,706,668 A | 1/1998 | Hilpert | |
| 5,714,938 A * | 2/1998 | Schwabl | 340/584 |
| 5,912,802 A | 6/1999 | Nelson | |
| 5,940,269 A | 8/1999 | Ko | |
| 6,024,164 A * | 2/2000 | Sorbel | 165/41 |
| 6,029,742 A | 2/2000 | Burward-Hoy | |
| 6,042,348 A | 3/2000 | Aakalu et al. | |
| 6,050,327 A | 4/2000 | Gates | |
| 6,115,251 A * | 9/2000 | Patel et al. | 361/699 |
| 6,125,924 A | 10/2000 | Lin | |
| 6,130,820 A | 10/2000 | Konstad | |
| 6,135,200 A | 10/2000 | Okochi | |
| 6,137,680 A | 10/2000 | Kodaira | |
| 6,170,561 B1 * | 1/2001 | O'Grady | 165/53 |
| 6,205,803 B1 | 3/2001 | Scaringe | |
| 6,213,194 B1 | 4/2001 | Chrysler | |
| 6,313,990 B1 | 11/2001 | Cheon | |
| 6,317,321 B1 * | 11/2001 | Fitch et al. | 361/700 |
| 6,364,761 B1 | 4/2002 | Steinbrecher | |
| 6,396,697 B1 | 5/2002 | Chen | |
| 6,397,618 B1 | 6/2002 | Chu | |
| 6,421,240 B1 * | 7/2002 | Patel | 361/699 |
| 6,438,984 B1 | 8/2002 | Novotny | |
| 6,526,768 B2 | 3/2003 | Wall | |
| 6,538,881 B1 | 3/2003 | Jeakins et al. | |
| 6,542,360 B2 | 4/2003 | Koizumi | |
| 6,587,343 B2 | 7/2003 | Novotny | |
| 2002/0173267 A1 | 11/2002 | Sharp | |
| 2002/0191430 A1 * | 12/2002 | Meir | 363/141 |
| 2003/0147216 A1 * | 8/2003 | Patel et al. | 361/700 |
| 2003/0209023 A1 | 11/2003 | Spinazzola | |
| 2004/0264124 A1 * | 12/2004 | Patel et al. | 361/686 |

FOREIGN PATENT DOCUMENTS

FR  2 568 712 A  2/1986

OTHER PUBLICATIONS

International Searching Authority, "International Search Report from PCT/US2005/003284 (S0104/7121WO)", Aug. 4, 2005, Patent Cooperation Treaty.

International Searching Authority, "International Search Report from PCT/US2005/002605 (S0104/7096WO)", Aug. 1, 2005, Patent Cooperation Treaty.

* cited by examiner

COOLING FAILURE MITIGATION FOR AN ELECTRONICS ENCLOSURE

TECHNICAL FIELD

The present invention generally relates to a system and method for mitigating failure of a cooling system for electronic components contained in an enclosure.

BACKGROUND ART

Various high power electronic components are often housed within an enclosure.

Due to their high power consumption, these electronic components generate heat, which if let unabated, can quickly lead to component failure and/or system shutdown.

To cool the electronic components, a cooling system is integrated within the enclosure. A typical cooling system includes a fan which generates a recirculating airflow over the electronic components. The airflow absorbs heat from, and cools, the electronic components. A fluidic circuit recirculates fluid through a heat exchanger positioned within the airflow, cooling the heated air. The heated fluid exiting the heat exchanger can be directed to, and cooled at, a location external to the enclosure.

Because of the very high power dissipation in the enclosure, any failure in the cooling system causes an instantaneous temperature rise within the enclosure. As a result, a system shutdown or failure may occur without sufficient time for an orderly shutdown. Consequently, critical data that is not stored in memory is often lost. This is particularly relevant in systems that handle large amount of data, and thus require several minutes for storage of data prior to shutdown.

SUMMARY OF THE INVENTION

In accordance with one aspect of the invention, a system for permitting orderly shutdown of electronic components in the event of a cooling failure is presented. The system includes an enclosure populated with one or more electronic components. At least one fan positioned within the enclosure generates an airflow across the one or more electronic components. The airflow is cooled by a heat exchanger. A phase change material positioned within the enclosure absorbs heat from the airflow upon a failure associated with the heat exchanger.

In accordance with another aspect of the invention, a method for cooling one or more electronic components positioned in an enclosure includes providing an air cooling element within the enclosure. An airflow is generated across the air cooling element and the one or more electronic components. Upon a failure in the cooling element, a phase change material positioned within the enclosure cools the airflow.

In accordance with yet another aspect of the invention, a cooling system includes an enclosure that houses one or more electronic components. The enclosure includes a means for generating an airflow across the one or more electronic components, and a cooling means for cooling the airflow. A phase change material is positioned in the airflow. The phase change material absorbs heat from the airflow upon a failure in the cooling means.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

In illustrative embodiments of the invention, a system and method is presented that allows for orderly shutdown of electronic components in an enclosure in the event of a cooling failure. To those ends, the system includes a phase change material which, upon a failure in a cooling element, maintains a predetermined temperature until an orderly shutdown can be performed. Details of various embodiments are discussed below.

Figure 1:
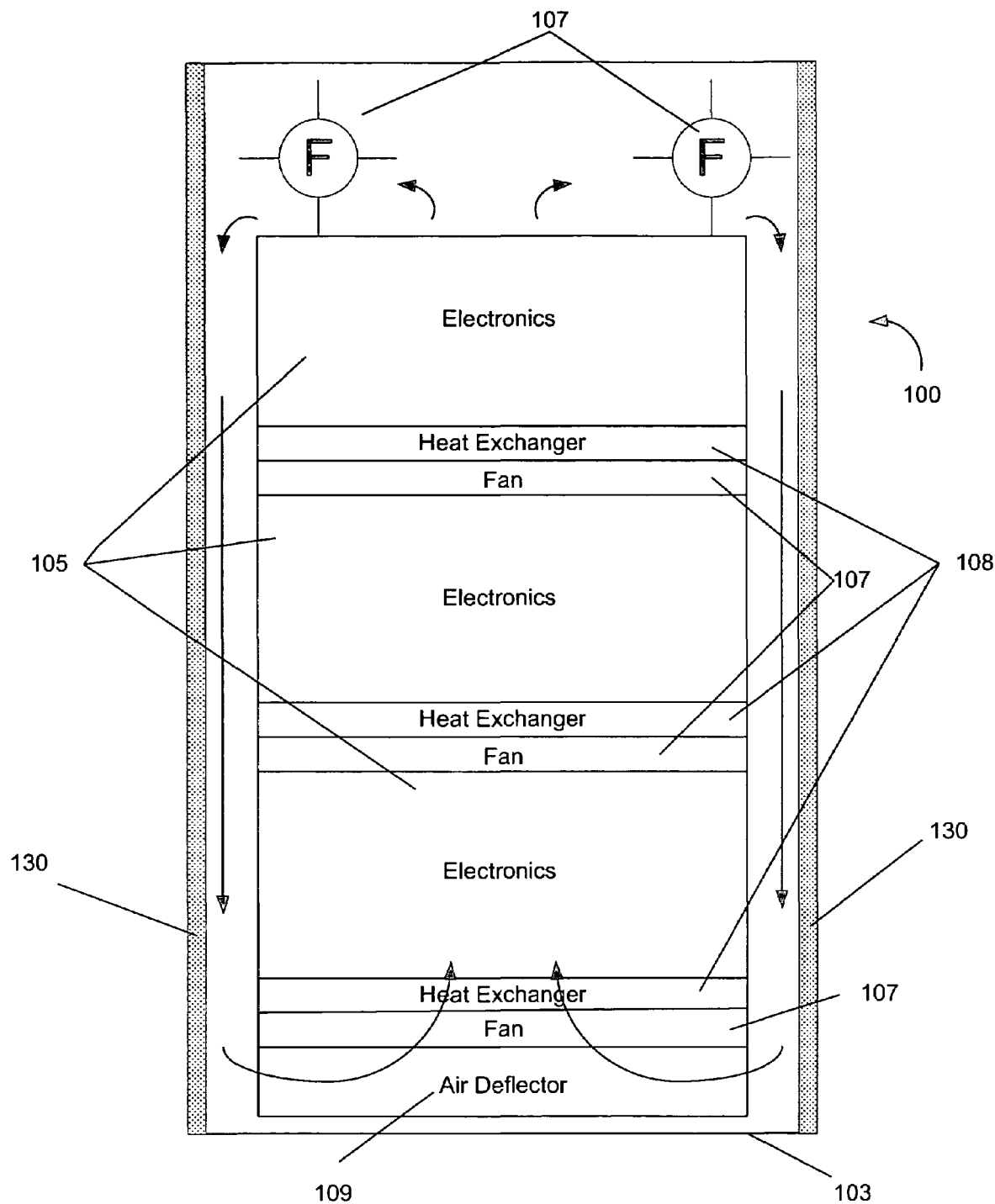
FIG. 1 is a schematic diagram of a system that permits orderly shutdown in the event of a cooling failure, in accordance with one embodiment of the invention.

FIG. 1 is a diagram illustrating a front view of a cooling system 100 that permits orderly shutdown of electronic components 105 in the event of a cooling failure, in accordance with one embodiment of the invention. The cooling system 100 is based on a substantially closed, recirculating airflow within an enclosure 103. Heat dissipated by the electronic components 105 is transferred to the airflow. At least one heat exchanger 108 serves to remove heat from the air.

The enclosure 103 may be of varying size and shape and include one or more doors for easy accessibility into the enclosure 103. In preferred embodiments, the enclosure 103 is kept substantially air-tight to maximize the efficiency of the cooling system 100. However, the enclosure may allow for limited flow of ambient air through the enclosure 103. In various embodiments, the enclosure 103 may initially take the form of a rack with one or more open sides, the rack becoming substantially enclosed after being populated with various panels, electronics and other modules.

The enclosure 103 is populated with various electronic components 105. Electronic components 105 include electronic devices whose operation involves the motion of electrical charge carriers, such as an integrated circuit. The electronic components 105 generate heat, and typically require some level of cooling to prevent component and/or system failure.

Electronic components 105 may include, without limitation, any number of power supplies, circuit boards, memory modules such as RAM, ROM, and various disks, and/or audio and video hardware. All or some of the electronic components 105 may be housed in at least one rack contained within the enclosure, such as a VME card rack. In various embodiments, the rack may support any number of blade servers, each blade server being an independent server module that typically includes one or more processors, memory, storage, network controllers, an operating system and/or various applications.

To generate airflow within the system 100, the system includes one or more fans 107. As used in this description and the accompanying claims, the term "fan" shall mean any device capable of moving air, unless the context otherwise requires. Fan 107 may be, for example, and without limitation, a blower.

The fans 107 generate an airflow that passes across and removes heat generated by the electronic components 105. To properly direct the airflow across the electronic components, any number of air deflectors 109, shrouds, and/or manifolds may be utilized.

The airflow generated by the fans 107 is substantially recirculated within the enclosure 103. In the exemplary embodiment illustrated in FIG. 1 the airflow is directed by tangential fans, positioned at the top of the enclosure 103, to the sides of the enclosure 103. The airflow is then forced downwards through a gap formed by the sides of the enclosure 103 and closed sides of the various electronic components 105. When the airflow reaches the bottom of the enclosure 103, an air deflector 109 redirects the airflow upward through the various electronic components 105. It is to be understood that the path of the airflow, the size and shape of enclosure, and the electronic components included in the enclosure are variable and are not limited to the embodiment illustrated in FIG. 1.

Positioned within the airflow is at least one heat exchanger 108, which serves to remove heat from the recirculating airflow. In embodiments having limited recirculation of airflow, the heat exchanger 108 may be positioned in close proximity to the fan output 105, such that the ambient portion of the airflow can be cooled by the heat exchanger 108 prior to passing over the electronic components 105.

Figure 2:
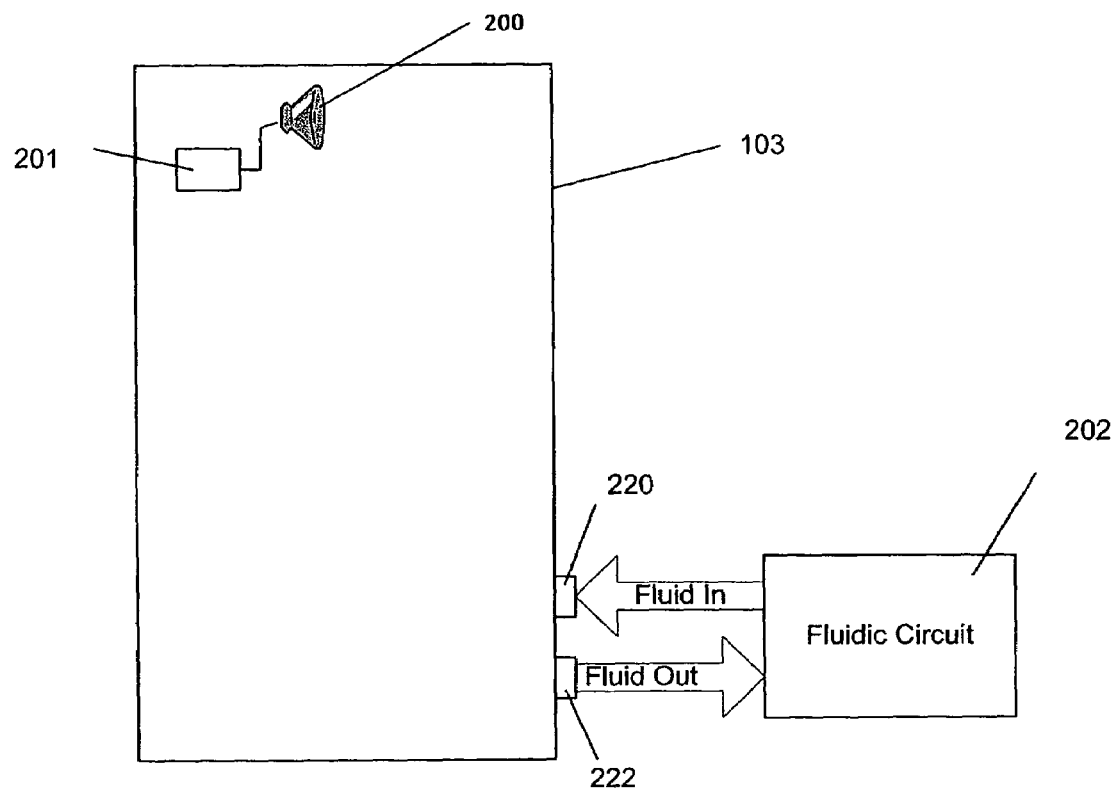
FIG. 2 is a block diagram of the system of FIG. 1 that includes an external fluidic circuit, in accordance with one embodiment of the invention.

The heat exchanger 108 may be, without limitation, a fluid to air heat exchanger that is coupled to a closed-loop fluidic circuit. FIG. 2 is a block diagram showing a fluidic circuit 202 coupled to the enclosure 103, in accordance with an embodiment of the invention. The fluidic circuit 202 circulates a fluid, such as water, water mixed with ethylene glycol, or other fluorinerts/fluid coolants known in the art. In various embodiments, the fluidic circuit may be a refrigeration circuit that circulates, for example, R134A, however, other refrigerants known in the art may be used. The fluid passing through the heat exchanger 108 acts to remove heat transferred to the air from the electronic components 105. In various embodiments, for example, the fluid flows through a coil of thin-walled tubes in the heat exchanger 108. Heat from the air is transferred to the tubes in the heat exchanger 108 which is then passed to the fluid. Tubing used to connect the elements in the closed-loop fluidic circuit may be made of various materials, such as, but not limited to, metals, plastic, and rubber. Metal components may be attached by welding or soldering the components together. A fan 107 may be positioned in close proximity to each heat exchanger 108 to ensure proper airflow through the heat exchanger 108.

Various elements of the fluidic circuit 202, may be external to the enclosure 103, such as a pump, and a second heat exchanger for cooling the heated fluid exiting the heat exchanger 108. As such, the enclosure 103 may include at least one fluidic input 220 for receiving cooled fluid from the fluidic circuit, and at least one output 222 for the fluid exiting the heat exchanger 108. In alternative embodiments, the entire fluidic circuit 202 may be contained within the enclosure 103. Elements of the fluidic circuit tending to add heat to the airflow may be partitioned off within the enclosure 103, so as to be isolated from the airflow.

In other embodiments, the heat exchanger 108 may be, for example, a thermoelectric device. The thermoelectric device may be, without limitation, a Peltier Effect cooling device. Peltier Effect cooling devices typically include a cooling surface and a heat dissipation surface, which are typically made of ceramic. P-type and n-type semiconductor material, connected electrically in series by electrical conductor, is coupled between the two surfaces. When a DC voltage is applied to the semiconductor material, electrons pass from the p-type material to the n-type material and heat is transferred from the cooling surface to the heat dissipation surface. The rate of heat transfer is proportional to the current and the number of p-n junctions. The cooling surface of the Peltier Effect cooling device is positioned within the enclosure 103 such that the airflow passes across it. In contrast, the heat dissipation surface is isolated, and positioned away, from the airflow. The heat dissipation surface may be further attached to a heat conductor, such as a metal pipe, that advantageously transfers the heat to a position in which it can be conveniently dissipated, such as a position external to the enclosure 103.

In accordance with illustrative embodiments of the invention, the enclosure 103 includes a phase change material 130 positioned in the airflow. Phase change materials are materials which change state (e.g., from solid to liquid and vice versa) as the temperature changes. A characteristic of a phase change material is that as the phase material is changing state, the phase change material remains at substantially constant temperature, referred herein as the phase change temperature. For example, a solid phase change material positioned in an enclosure will begin to change from solid to liquid when the temperature within the enclosure rises to reach the phase change temperature. While the phase change is occurring, the phase change material continues to absorb heat while remaining at nearly a constant temperature. After changing phase (e.g. from a solid to a liquid), the temperature of the phase material will begin to rise again. Upon subsequent cooling to the phase change temperature, the phase change material will give off heat to the surrounding environment, and return back to its solid phase. Phase change materials include, without limitation, various paraffins, hydrated salts, metals, alloys, and organic acids, such as: linear crystalline alkyl hydrocarbons; fatty acids and esters; polyethylene glycols; long alkyl side chain polymers; the solid state series of pentaerythritol, pentaglycerine, and neopentyl glycol; gallium; cesium; rubidium; and quaternary ammonium clathrates and semi-clathrates.

Figure 3:
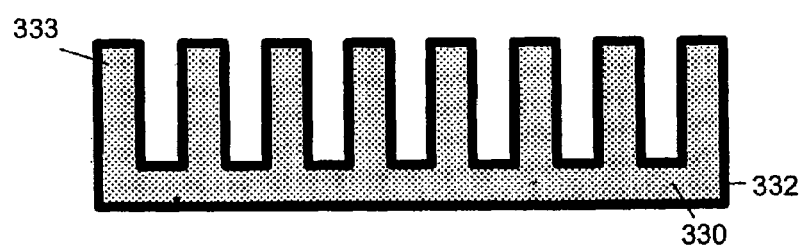
FIG. 3 is a diagram illustrating a phase change material enclosed in a container, in accordance with one embodiment of the invention.

The phase change material 330 may be enclosed in at least one container 332 positioned within the enclosure, as shown in FIG. 3 in accordance with one embodiment of the invention. The container 332 may be made of, for example, a heat-conductive metal, alloy, or polymer. The container 332 may be of various size and shape. For example, the container 332 may be rectangular or circular in nature. In various embodiments, the container 332 may include fins 333, similar to conventional heat sinks, to advantageously increase surface contact with the airflow.

The chamber in the container 332 may be larger than the volume of the phase change material 330 when in solid form, as the volume of the phase change material 330 typically increases when the phase change material 330 turns to liquid. In various embodiments, the container 332 may be, for example, a bladder made of an elastic material that is capable of expanding as the phase change material turns to liquid.

Figure 4:
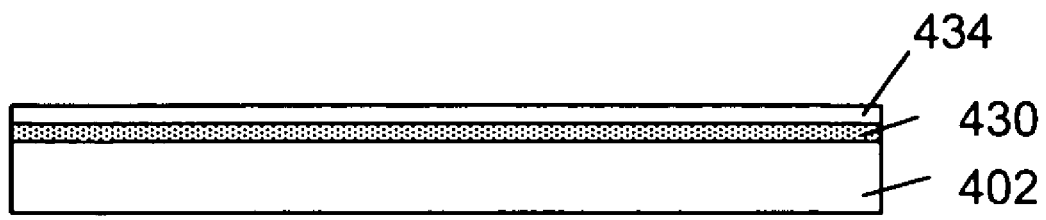
FIG. 4 is a diagram illustrating a surface coated with phase change material followed by an encapsulating sealing coat, in accordance with one embodiment of the invention.
Figure 5:
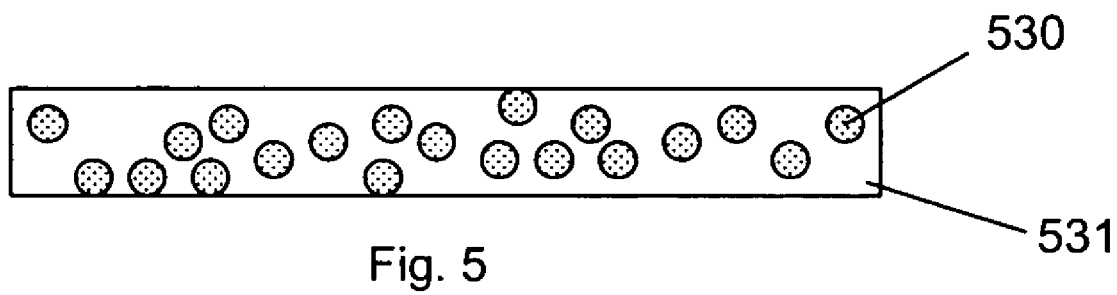
FIG. 5 is a diagram illustrating encapsulated phase change material embedded in portions of a material, in accordance with one embodiment of the invention.

In other embodiments, one or more surfaces 402 within the enclosure may be coated with phase change material 430 followed by an encapsulating sealing coat 434, as shown in FIG. 4. Multiple layers of phase change material 430 may be applied, with each layer having a different or the same phase change temperature. In still other embodiments, encapsulated phase change material 530 may be embedded in portions of material 531 contained within the enclosure, as shown in FIG. 5. The phase change material 530 may be encapsulated using conventional, commercially available microencapsulation techniques to produce pellets or microspheres. In exemplary embodiments, a plastic composition may be fabricated using injection molding, the plastic material including the microencapsulated phase change material. Alternatively, a paint applied to various surfaces within the enclosure may be loaded with the microencapsulated phase change material.

Referring back to FIG. 1, the phase change material 130 may be selected to have a phase change temperature that is above the airflow temperature when there is no failure associated with the heat exchanger 108, and below a maximum operating temperature of the one or more electronic components 105. When a failure in the heat exchanger 108 occurs, the temperature of the airflow within the enclosure 103 will quickly start to rise until reaching the phase change temperature of the phase change material 130. The phase change material 130 will then start to melt, absorbing heat from the airflow. The temperature of the phase change material 130 will remain substantially constant while melting, thus stabilizing the temperature of the airflow passing over the phase change material. After the phase change material 130 is completely melted, the temperature of the airflow will resume rising.

Thus, the amount of time required to reach the maximum operating temperature the one or more electronic components 105, in the event of a failure in the cooling system, is increased. This additional time can be advantageously used to complete an orderly shut-down of the one or more electronic components. For example, the additional time may be used to ensure that any critical data is saved to a disk/hard drive prior to shut-down.

Referring back to FIG. 2, the system may include at least one temperature sensor 201, in accordance with one embodiment of the invention. The temperature sensor 201 generates a signal representative of the temperature within the enclosure 103. Based on the signal, a high-temperature indication 202 may be provided that alerts an operator in the event of an increase in temperature within the enclosure 103. The high-temperature indications may be, for example, in the form of a visual alert on a front-panel of the enclosure 103, and/or audio alarms. In such embodiments, the high temperature indication may advantageously be set at a temperature that is equal to, or lower, than the phase change temperature of the phase change material 130. Upon a failure in the cooling system, the phase change material 130 provides enough time for an operator, alerted by the high-temperature indication, to shut down the electronic components in an orderly manner. In alternative embodiments, the signal may automatically trigger an orderly shut down of the electronic components, without operator intervention.

Although various exemplary embodiments of the invention have been disclosed, it should be apparent to those skilled in the art that various changes and modifications can be made which will achieve some of the advantages of the invention without departing from the true scope of the invention. These and other obvious modifications are intended to be covered by the appended claims.

What is claimed is:

1. A system for permitting orderly shutdown of electronic components, the system comprising:
   an enclosure having an interior surface;
   one or more electronic components positioned within the enclosure;
   at least one fan positioned within the enclosure for generating an airflow across the one or more electronic components;
   a heat exchanger for cooling the airflow; and
   a plurality of phase change material layers disposed upon the interior surface, at least one of the layers exposed to the airflow within the enclosure generated by the fan for absorbing heat from the airflow upon a failure associated with the heat exchanger, a first phase change material layers having a phase change temperature different from a second of the phase change material layers.

2. The system according to claim 1, wherein at least one of the layers of the phase change material has a phase change temperature that is above a temperature of the airflow when there is no failure associated with the heat exchanger, and below a maximum operating temperature of the one or more electronic components.

3. The system according to claim 1, wherein the heat exchanger is a fluid to air heat exchanger.

4. The system according to claim 3, wherein the fluid to air heat exchanger is coupled to a fluidic circuit.

5. The system according to claim 4, wherein the fluidic circuit circulates one of a refrigerant and water.

6. The system according to claim 1, wherein the heat exchanger is a thermoelectric device.

7. The system according to claim 1, wherein the phase change material is in micro-encapsulated form that is embedded in a coating applied to one or more interior surfaces of the enclosure.

8. The system according to claim 1, wherein one or more interior surfaces of the enclosure is coated with the phase change material, the phase change material encapsulated by a sealing coat.

9. The system according to claim 1, further comprising:
   a temperature sensor for sensing temperature within the enclosure; and
   a high-temperature indication indicative of a high temperature within the enclosure, the high temperature being lower than a phase change temperature of the phase change material.

10. The system according to claim 1, wherein the phase change material is a material chosen from the group of materials consisting of a paraffin, a hydrated salt, a metal, an alloy, and an organic acid.

11. The system according to claim 1, wherein the at least one fan substantially recirculates air within the enclosure.

12. The system according to claim 1, wherein the one or more electronic components includes at least one blade server.

13. A method for cooling one or more electronic components positioned in an enclosure, the method comprising:
   providing an air cooling element within the enclosure;
   generating an airflow across the cooling element and one or more electronic components positioned within the enclosure; and
   cooling the airflow using a plurality of layers of phase change material upon a failure in the cooling element, the phase change material positioned on an interior surface of the enclosure and exposed to the airflow within the enclosure generated by the fan.

14. The method according to claim 13, wherein providing the air cooling element includes: moving fluid through a fluidic circuit, the fluidic circuit including a fluid to air heat exchanger.

15. The method according to claim 14, further comprising pumping one of a water and a refrigerant through the fluidic circuit.

16. The method according to claim 13, wherein the air cooling element is a thermoelectric device.

17. The method according to claim 13, further comprising providing an indication indicative of a high temperature condition within the enclosure.

18. The method according to claim 13, further including shutting down the one or more electronic components upon a failure in the fluidic circuit.

19. The method according to claim 13, wherein the phase change material has a melting point that is above a temperature of the airflow when there is no failure in the air cooling element, and below a maximum operating temperature of the one or more components.

20. The method according to claim 13, further comprising encapsulating the phase change material in a surface positioned within the airflow.

21. The method according to claim 13, further comprising: applying the phase change material to a surface positioned within the airflow, and applying a sealing coat on top of the phase change material.

22. The method according to claim 13, wherein the one or more electronic components includes at least one blade server.

23. A cooling system comprising:
an enclosure;
one or more electronic components positioned within the enclosure;
means for generating an airflow across the one or more electronic components;
cooling means for cooling the airflow; and
a phase change material at least partially comprising a hydrated salt and positioned within the enclosure in the airflow generated by the means for generating an airflow across the one or more electronic components, the phase change material for absorbing heat from the airflow upon a failure in the cooling means.

24. The cooling system according to claim 23, wherein the means for generating the airflow includes a fan.

25. The cooling system according to claim 23, wherein the cooling means includes a fluid to air heat exchanger.

26. The cooling system according to claim 25, wherein the fluid to air heat exchanger is coupled to a fluidic circuit that circulates one of a refrigerant and a water.

27. The cooling system according to claim 23, wherein the cooling means includes a thermoelectric device.

28. The cooling system according to claim 23, wherein the phase change material is enclosed in a container.

29. The cooling system according to claim 28, wherein the container includes fins for dissipating heat.

30. The cooling system according to claim 23, wherein the phase change material is encapsulated in a surface positioned within the airflow.

31. The cooling system according to claim 23, wherein one or more surfaces of the enclosure is coated with the phase change material, the phase change material encapsulated by a sealing coat.

32. The cooling system according to claim 23, wherein the phase change material is a material chosen from the group of materials consisting of a paraffin, a hydrated salt, a metal, an alloy, and an organic acid.

33. The method according to claim 23, wherein the one or more electronic components includes at least one blade server.

* * * * *